United States Patent
Goswami (10) Patent No.: US 8,846,512 B2
(45) Date of Patent: *Sep. 30, 2014

(54) INCORPORATING IMPURITIES USING A MASK

(71) Applicant: Micron Technology, Inc., Boise, ID (US)

(72) Inventor: Jaydeb Goswami, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/936,724

(22) Filed: Jul. 8, 2013

(65) Prior Publication Data

US 2013/0295760 A1  Nov. 7, 2013

Related U.S. Application Data

(63) Continuation of application No. 13/083,155, filed on Apr. 8, 2011, now Pat. No. 8,481,414.

(51) Int. Cl.
| | |
|---|---|
| *H01L 21/22* | (2006.01) |
| *H01L 21/28* | (2006.01) |
| *H01L 29/66* | (2006.01) |
| *H01L 29/788* | (2006.01) |
| *H01L 21/3215* | (2006.01) |
| *H01L 27/115* | (2006.01) |

(52) U.S. Cl.
CPC .... *H01L 21/28273* (2013.01); *H01L 29/66825* (2013.01); *H01L 29/7881* (2013.01); *H01L 21/32155* (2013.01); *H01L 27/11521* (2013.01)
USPC .......................................... 438/558; 438/542

(58) Field of Classification Search
USPC .......................... 438/542, 555, 558, 559, 561
See application file for complete search history.

(56) References Cited

U.S. PATENT DOCUMENTS

| | | | |
|---|---|---|---|
| 4,087,315 A | 5/1978 | Auracher et al. | |
| 4,381,957 A | 5/1983 | Punter et al. | |
| 4,720,469 A | 1/1988 | Keser et al. | |
| 6,780,242 B2 | 8/2004 | Norris | |
| 7,041,530 B2 | 5/2006 | Nunoshita et al. | |
| 7,208,365 B2 * | 4/2007 | Chae et al. | 438/201 |
| 7,208,793 B2 | 4/2007 | Bhattacharyya | |
| 7,242,613 B2 | 7/2007 | Sakui et al. | |
| 7,309,650 B1 | 12/2007 | Wang et al. | |
| 7,393,745 B2 | 7/2008 | Jeng | |
| 7,507,627 B2 | 3/2009 | Cheong et al. | |
| 2002/0086503 A1 * | 7/2002 | Schuegraf et al. | 438/549 |
| 2007/0105312 A1 | 5/2007 | Min | |
| 2009/0101964 A1 | 4/2009 | Choi et al. | |
| 2010/0090265 A1 | 4/2010 | Bhattacharyya et al. | |
| 2011/0006359 A1 | 1/2011 | Anderson et al. | |

* cited by examiner

*Primary Examiner* — Fernando L Toledo
*Assistant Examiner* — Bryan Junge
(74) *Attorney, Agent, or Firm* — Dicke, Billig & Czaja, PLLC (57) ABSTRACT

Methods of incorporating impurities into materials can be useful in non-volatile memory devices as well as other integrated circuit devices. Various embodiments provide for incorporating impurities into a material using a mask.

23 Claims, 5 Drawing Sheets

INCORPORATING IMPURITIES USING A MASK

RELATED APPLICATIONS

This application is a continuation of U.S. patent application Ser. No. 13/083,155, entitled, "INCORPORATING IMPURITIES USING A DISCONTINUOUS MASK," filed on Apr. 8, 2011 (allowed), which application is commonly assigned and incorporated in its entirety herein.

TECHNICAL FIELD

The present disclosure relates generally to doping of materials and, in particular, in one or more embodiments, the present disclosure relates to the incorporation of impurities using a discontinuous mask.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming (which is sometimes referred to as writing) of charge storage structures (e.g., floating gates or charge traps) or other physical phenomena (e.g., phase change or polarization), determine the data value of each cell. Common uses for flash memory include personal computers, personal digital assistants (PDAs), digital cameras, digital media players, cellular telephones, solid state drives and removable memory modules, and the uses are growing.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select lines, a source select line and a drain select line. A "column" refers to a group of memory cells that are commonly coupled to a local data line, such as a local bit line. It does not require any particular orientation or linear relationship, but instead refers to the logical relationship between memory cell and data line. The source select line includes a source select gate at each intersection between a NAND string and the source select line, and the drain select line includes a drain select gate at each intersection between a NAND string and the drain select line. Each source select gate is connected to a source line, while each drain select gate is connected to a data line, such as column bit line.

As memory densities increase, issues with data retention tend to worsen. For example, while polysilicon (sometimes referred to as polycrystalline silicon) charge storage structures have been commonly used for years, they tend to become impracticable as their thickness becomes too thin, e.g., around 6 nm or less. The practicality of polysilicon charge storage structures can be improved through the incorporation of low-concentration metal impurities within the polysilicon, e.g., on the order of 1E20 atoms/$cm^3$ or less. However, conventional methods of doping such metal impurities are thought to present their own challenges. For example, in beam-line implantation of impurities, low energy levels would be necessary for such low-level implantations, which may not be viable for cost-effective implantation rates. Furthermore, in plasma doping, it is difficult to form a plasma source from a pure metal, and additional impurities, such as carbon, of the metal source gases could lead to undesirable levels of these impurities in the polysilicon. For the reasons stated above, and for other reasons stated below which will become apparent to those skilled in the art upon reading and understanding the present specification, there is a need in the art for alternative methods of incorporating impurities.

DETAILED DESCRIPTION

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, chemical and electrical changes may be made without departing from the scope of the present disclosure. The term semiconductor can refer to, for example, a layer of material, a wafer, or a substrate, and includes any base semiconductor structure. "Semiconductor" is to be understood as including silicon on sapphire (SOS) technology, silicon on insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure. The following detailed description is, therefore, not to be taken in a limiting sense.

Traditional floating gate NAND flash structures often use a thick polysilicon (sometimes referred to as polycrystalline silicon) floating gate which can have the control gate wrapped around it, allowing it to program and erase with a silicon dioxide intergate dielectric on the polysilicon. However, this geometry may soon be impracticable to sustain in smaller devices because there may not be enough room to wrap the intergate dielectric and control gate around the polysilicon floating gate. Using this same materials stack in a planar geometry is generally unsatisfactory and may even fail to program. To address this issue, metal-doped polysilicon may be required. Desired doping levels are expected to be very low, on the order of 1E20 atoms/$cm^3$ or less. As noted earlier, low doping levels in thin layers may be problematic. Various embodiments described herein address the issue of attaining low levels of impurities, e.g., metals or metal alloys, in a material, e.g., polysilicon.

Various embodiments include methods of incorporating impurities into a material using a discontinuous mask. As an example, a discontinuous mask is formed over a material in which the impurities are desired, e.g., polysilicon. The discontinuous mask covers a portion of the underlying material while leaving a remaining portion exposed. The impurity material, e.g., a metal or metal alloy, is then formed on the discontinuous mask and the exposed portion of the underlying material, also in a discontinuous manner, e.g., metal nanodots. A portion of the impurity material will thus be formed on the exposed portion of the underlying material and a remaining portion of the impurity material will be formed on the discontinuous mask. The impurity material formed on the exposed portion of the underlying material is then incorporated into the underlying material, while incorporation of impurity material formed on the discontinuous mask into the underlying material is mitigated or blocked by the discontinuous mask. The discontinuous mask is then removed, thus also removing that portion of the impurity material formed thereon. While various embodiments are described with particular reference to incorporating metal into polysilicon, it will be apparent that the methods described herein may be utilized for a variety of materials. Similarly, while various embodiments are described in the context of forming a charge storage structure of a memory cell, other applications utilizing a material with impurities incorporated therein are may also be formed in accordance with embodiments of this disclosure.

FIGS. 1A-1G depict a portion of a memory array during various stages of fabrication of a charge storage structure in accordance with an embodiment of the disclosure. FIGS. 1A-1G demonstrate a particular use for incorporating impurities using a discontinuous mask.

Figure 1A:
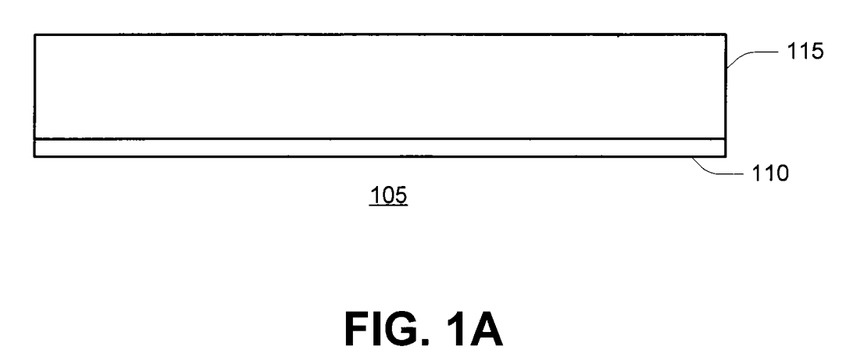
FIGS. 1A-1G depict a portion of a memory array during various stages of fabrication in accordance with an embodiment of the disclosure.

Formation of the structure of FIG. 1A can include formation of gate dielectric 110 over an active region of a semiconductor 105, e.g., an area over which memory cells will be formed. For example, the active region of the semiconductor 105 may include a conductively-doped well of a semiconductor wafer. The gate dielectric 110 is generally one or more dielectric materials. The gate dielectric 110 might be formed, for example, by thermal oxidation of the semiconductor 105. Alternatively, the gate dielectric 110 could be formed, for example, by a blanket deposition of a dielectric material. Example dielectric materials for gate dielectric 110 include silicon oxides (SiOx), silicon nitride (SiNx), silicon oxynitrides (SiOxNy), aluminum oxides (AlOx), hafnium oxides (HfOx), hafnium aluminum oxides (HfAlOx), lanthanum oxides (LaOx), tantalum oxides (TaOx), zirconium oxides (ZrOx), zirconium aluminum oxides (ZrAlOx), etc., and combinations thereof A charge storage material 115 is formed over the gate dielectric 110. The charge storage material 115 is generally one or more materials capable of storing a charge. For one embodiment, the charge storage material 115 is a silicon-containing material. Examples include polysilicon, amorphous silicon and monocrystalline silicon. Alternatively, the charge storage material 115 may be, for example, a germanium-containing material. The charge storage material 115 may be an undoped or conductively doped material. For example, the charge storage material 115 might be a polysilicon material having a p-type conductivity. Conductively doping semiconductor materials, such as germanium, monocrystalline silicon, amorphous silicon and polysilicon, may be performed subsequent to formation or concurrent with formation.

For one embodiment, the charge storage material 115 has a thickness of approximately 1 nm to 10 nm. For a further embodiment, the charge storage material 115 has a thickness of around 6 nm or less, such as approximately 3 nm to 5 nm. It is recognized that the variability of industrial fabrication will inherently produce minor variations in thickness such that a process seeking a particular thickness, e.g., 3 nm, will likely produce thicknesses cell-to-cell that are above and below that particular value.

Figure 1B:
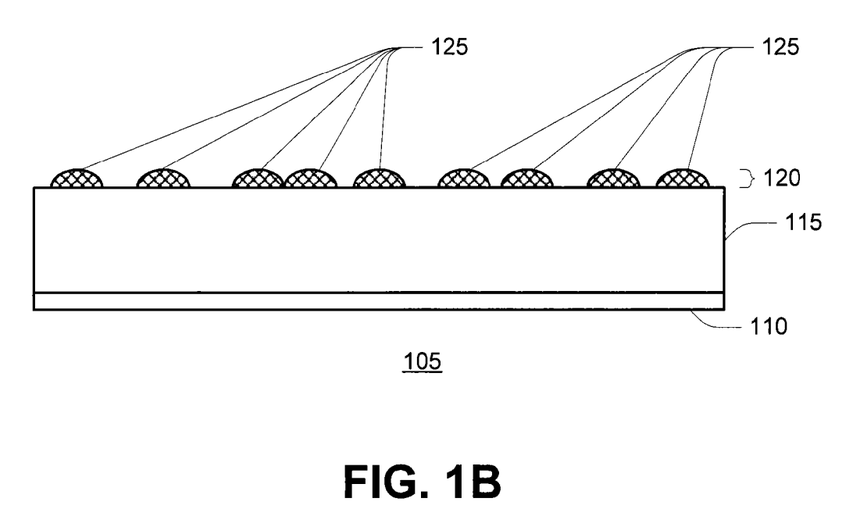

In FIG. 1B, a discontinuous mask 120 is formed on the charge storage material 115. The discontinuous mask 120 may be in the form of discrete formations, i.e., islands, 125 of material used to form the discontinuous mask 120. The islands 125 may be formed in a pseudo-random pattern, i.e., the location of individual islands are not selected by some predefined or other particular pattern, but are largely determined by the surface characteristics of the underlying material. Some of the islands 125 may be isolated from other islands 125, while some islands 125 may be in contact with other islands 125. In general, however, the discontinuous mask 120 covers at least a portion of the charge storage material 115 and exposes at least a portion of the charge storage material 115.

The islands 125 of the discontinuous mask may be formed by chemical vapor deposition (CVD). One particular form of CVD is atomic layer deposition (ALD). ALD, also known as atomic layer epitaxy (ALE) is a form of CVD widely used in semiconductor fabrication to form layers of material of very thin dimensions, typically on the atomic scale. The ALD process consists of an alternating series of self-limiting chemical reactions, called half-reactions, between gas-phase precursors and a substrate. The precursors are pulsed into the reactor in a sequential fashion, with purging of precursors in between. A series of these pulse/purge/pulse/purge cycles can be used to form a continuous layer of material.

To form a discontinuous mask 120 using ALD, however, instead of completing the ALD process, the process is halted prematurely. For example, an ALD process can be used to form a material on a substrate and halted before the material forms a continuous layer. Forming a discontinuous material in this manner is described in further detail in U.S. Patent Application Publication No. 2009/0273016 A1 to Prashant et al., published on Nov. 5, 2009.

Alternatively, CVD is known to preferentially form material at nucleation sites on the underlying material. For example, grain boundaries of a polycrystalline underlying material, such as polysilicon, may provide nucleation sites at which CVD reactions would preferentially take place, thereby forming the islands 125 if the CVD process is halted prior to forming a continuous layer. As another example, nucleation sites may be formed using a seed layer, such as by inducing surface irregularities on the underlying material, e.g., through ion implantation or sputtering. Other methods may also be used to form the discontinuous mask 120. For example, a physical vapor deposition (PVD) process may be used. Some examples of PVD include evaporative deposition, where a target material is heated to vaporization; electron beam evaporation, where an electron beam is used to vaporize a target anode; pulsed-laser deposition, where a laser is used to ablate a target material; and sputtering, where a target material is subjected to a plasma to release its component materials. Where energetic PVD processes are utilized, such as sputtering, it may be desirable to maintain energy levels such that the discontinuous mask 120 is formed on the surface of the charge storage material 115, rather than implanting into or below the surface of the charge storage material 115, to mitigate surface damage to the charge storage material 115 and to facilitate subsequent removal of the discontinuous mask 120. Each of these methods of forming the discontinuous mask 120 might be used provided they are ceased prior to forming a continuous layer of material that would leave no portion of the charge storage material 115 exposed where incorporation of impurities is desired.

Levels of impurity incorporation can be controlled by controlling the amount of the charge storage material 115 exposed through the discontinuous mask 120. For example, larger percentages of exposed surface area for the charge storage material 115 generally facilitate higher levels of incorporation of impurities. For some embodiments, the discontinuous mask 120 exposes 20-80% of the charge storage material 120. For some embodiments, the majority of islands 125 of the discontinuous mask 120 are 1 nm-5 nm in diameter. It is recognized that the islands 125 are not necessarily round in shape. As such, the diameter is necessarily an approximation, and herein refers to the diameter of a circle in which an island 125 would fit. For further embodiments, the islands 125 of the discontinuous mask 120 are separated by an average distance of 1 nm-2 nm from neighboring islands 125.

For various embodiments, the discontinuous mask 120 is formed of a material that is selective to removal over the charge storage material 115, i.e., the discontinuous mask 120 can be removed from the charge storage material 115 without excessively removing or damaging the charge storage material 115. For example, where the charge storage material 115 is a polysilicon material, the discontinuous mask 120 may be formed of tantalum nitride (TaN) for example. Tantalum nitride can be removed using a wet etch of SC1 (standard clean 1) solution, which is well known in the art of semiconductor fabrication to be an aqueous solution containing ammonium hydroxide and hydrogen peroxide, while an underlying polysilicon charge storage material 115 may be substantially unharmed by the SC1 solution. Because the discontinuous mask 120 is sacrificial, it may be a conductive material, a dielectric material or a semiconductor material.

For various further embodiments, the discontinuous mask 120 may be formed of a material that is substantially unreactive with the selected impurity material and the underlying material. In this manner, during subsequent diffusion of the impurity material, reaction between the discontinuous mask 120 and the impurity material or the charge storage material 115 may not interfere with the diffusion process.

Figure 1C:
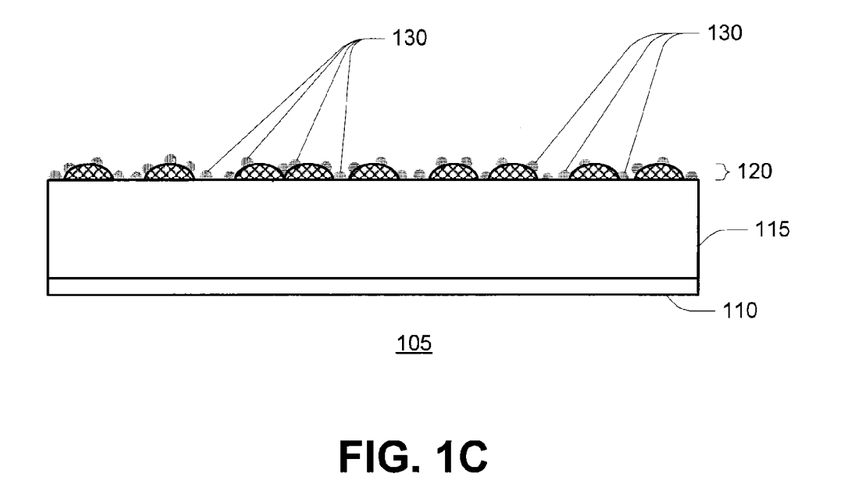

In FIG. 1C, an impurity material 130, e.g., a metal, such as ruthenium (Ru), titanium (Ti), tantalum (Ta), tungsten (W), rhodium (Rh), platinum (Pt), etc., or metal alloys thereof, is formed on exposed portions of the charge storage material 115 and on the discontinuous mask 120 in a discontinuous manner. The impurity material 130 may be formed on the surfaces of the charge storage material 115 and the discontinuous mask 120, such as through CVD or a non-implanting PVD process. Alternatively, the impurity material 130 may be partially or even fully implanted below the surface of one or both of the charge storage material 115 and the discontinuous mask 120, such as through a plasma or other ionizing PVD process. Even if the impurity material 130 is formed to implant below the surface of a material, it will be referred to herein as being formed on that material. Regardless of the process of formation, the formation of the impurity material 130 does not form a continuous layer of the impurity material 130.

Figure 1D:
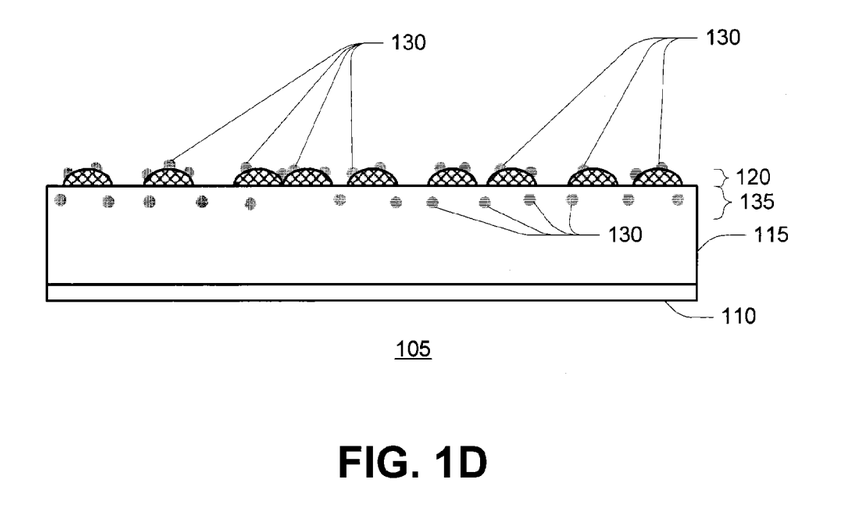

In FIG. 1D, the impurity material 130 formed on exposed portions of the charge storage material 115 is incorporated, e.g., diffused, into the charge storage material 115, thereby forming a doped region 135. Such incorporation can be accomplished by annealing the structure, such as by rapid thermal processing (RTP). Times and temperatures of the anneal will be dependent upon the impurity material, and the material into which the impurity material is to be incorporated. In general, however, shorter times and/or lower temperatures typically lead to more localized diffusion, i.e., near the surface of the charge storage material 115, while longer times and/or higher temperatures typically lead to more even diffusion within the charge storage material 115. The impurity material 130 formed on the discontinuous mask 120 may or may not be incorporated into the material of the discontinuous mask 120. In at least one embodiment, the material of the discontinuous mask 120 is chosen to act as a barrier to the impurity material 130, such that the impurity material 130 formed on the discontinuous mask 120 can be blocked from being incorporated into the charge storage material 115 during incorporation of the impurity material 130 formed on exposed portions of the charge storage material 115.

For one embodiment, the doped region 135 has a thickness of 5 nm or less. For example, the doped region 135 can have a thickness of 2 nm-5 nm. For a further embodiment, the doped region 135 has a thickness substantially equal to a thickness of the charge storage material 115.

Figure 1E:
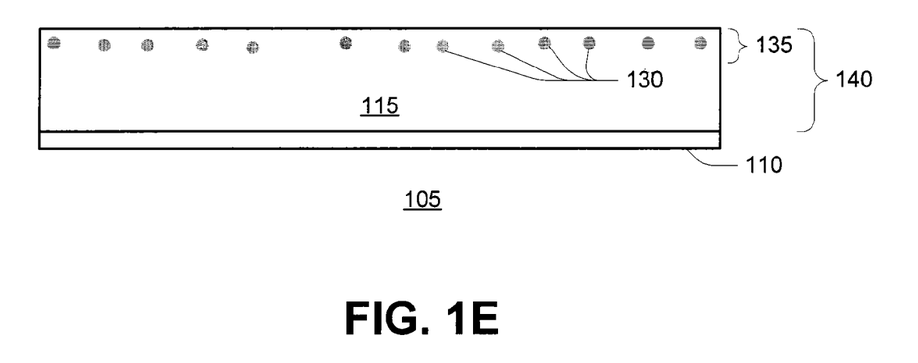

In FIG. 1E, the discontinuous mask 120, and the impurity material 130 formed on the discontinuous mask 120, are removed. For various embodiments, the removal is performed concurrently. For example, the impurity material 130 formed on the discontinuous mask 120 can be removed by etching the discontinuous mask 120. Thus, even where the chemistry of the etch would not effectively etch the impurity material 130 itself, by removing the discontinuous mask 120 on which it is formed, this impurity material 130 will effectively be removed as well. The charge storage material 115 and its doped region 135 may collectively define a charge storage structure 140.

Figure 1F:
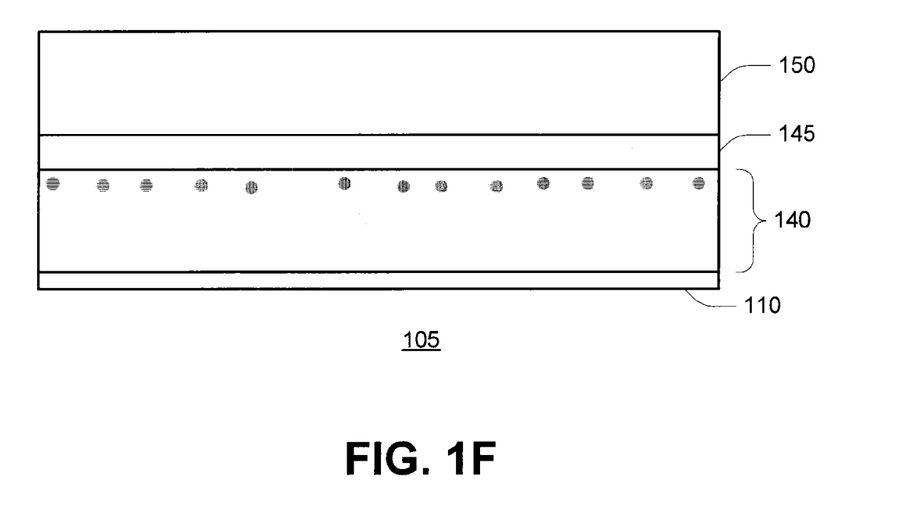

In FIG. 1F, an intergate dielectric 145 is formed over the charge storage structure 140. The intergate dielectric 145 is generally one or more dielectric materials. For example, the intergate dielectric 145 may include one or more layers of dielectric materials including high-K dielectric materials, generally considered to be dielectric materials having a dielectric constant K greater than that of silicon dioxide. Example high-K dielectric materials for intergate dielectric 145 include aluminum oxides (AlOx), hafnium oxides (HfOx), hafnium aluminum oxides (HfAlOx), hafnium silicon oxides (HfSiOx), lanthanum oxides (LaOx), tantalum oxides (TaOx), zirconium oxides (ZrOx), zirconium aluminum oxides (ZrAlOx), yttrium oxide ($Y_2O_3$), etc.

A control gate 150 is formed over the intergate dielectric 145. In general, the control gate 150 includes one or more conductive materials. For one embodiment, the control gate 150 contains a conductively-doped polysilicon. For another embodiment, the control gate 150 contains a metal-containing material. For a further embodiment, the control gate 150 includes a metal-containing material over polysilicon, e.g., a refractory metal silicide formed on a conductively-doped polysilicon. The metals of chromium (Cr), cobalt (Co), hafnium (Hf), molybdenum (Mo), niobium (Nb), tantalum (Ta), titanium (Ti), tungsten (W), vanadium (V), zirconium (Zr), and metal nitrides (including, for example, titanium nitride, tantalum nitride, tantalum carbon nitride, tungsten nitride, etc.) for metal gates are generally recognized as refractory metal materials. For another embodiment, the control gate 150 contains multiple metal-containing materials, e.g., a titanium nitride (TiN) barrier over the intergate dielectric 145, titanium (Ti) as an adhesion material over the barrier, and tungsten (W) over the adhesion material.

Figure 1G:
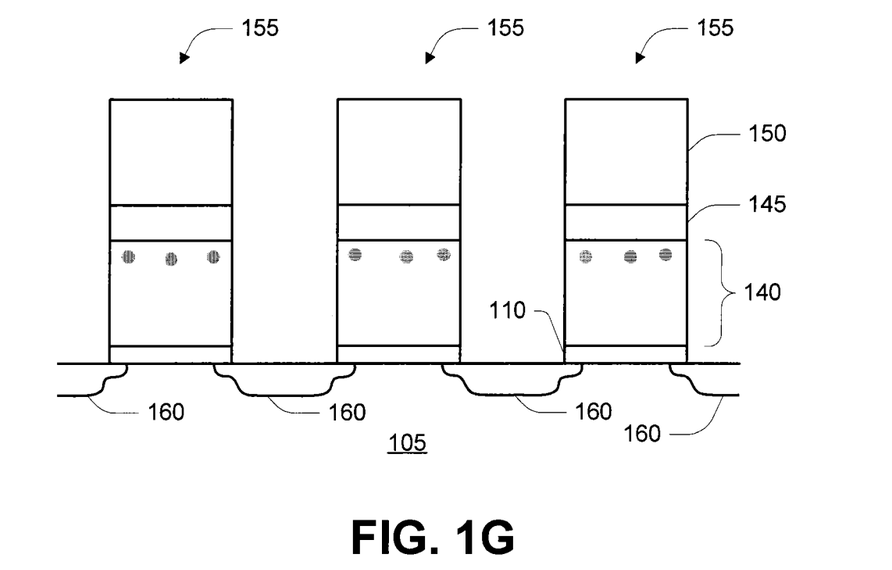

In FIG. 1G, the gate dielectric 110, charge storage structure 140, intergate dielectric 145 and control gate 150 are patterned to define individual memory cells 155. Source/drain regions 160 are formed in the substrate 105 to couple the memory cells 155 in a serial fashion as part of a NAND string of serially-coupled non-volatile memory cells 155. The source/drain regions 160 are formed between the memory cells 155, generally at opposing ends of the gate dielectrics 110 of the memory cells 155. A channel region of a memory cell 155 is defined by the area of the semiconductor 105 between the source/drain regions 160. Source/drain regions 160 will generally have a conductivity type different than the conductivity type of the semiconductor 105. The conductivity types may be opposites. For example, for a p-type semiconductor 105, the source/drain regions 160 might have an n+-type conductivity.

Figure 2:
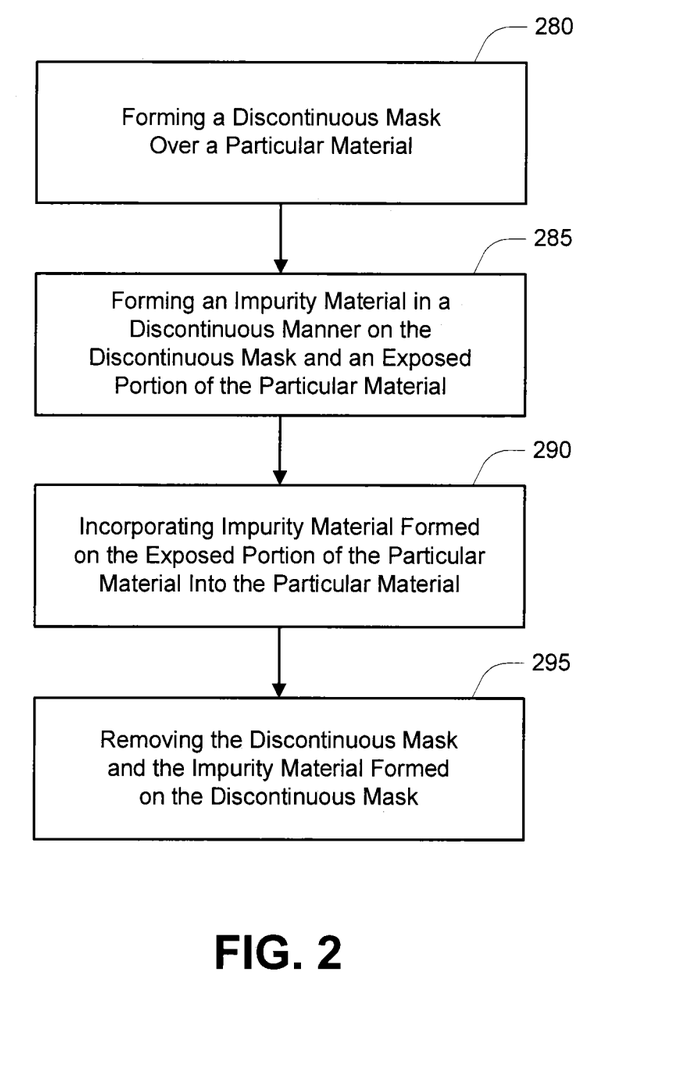
FIG. 2 is a flowchart of a method of incorporating impurities in accordance with an embodiment of the disclosure.

FIG. 2 is a flowchart of a method of incorporating impurities in accordance with an embodiment of the disclosure. At 280, a discontinuous mask is formed on a particular material, leaving at least a portion of the particular material exposed. The discontinuous mask may be in the form of discrete formations, i.e., islands, of material used to form the discontinuous mask such as described with reference to FIG. 2B. At 285, an impurity material is formed in a discontinuous manner, e.g., nanodots of the impurity material, on the discontinuous mask and the exposed portion of the particular material. For example, the impurity material may be formed to be on a surface of the discontinuous mask and/or the exposed portion of the particular material, or it may be formed such that at least a portion of the impurity material is partially or even fully implanted below the surface of one or both of the discontinuous mask and the exposed portion of the particular material. At 290, impurity material formed on the exposed portion of the particular material is incorporated into the particular material. Incorporation can include diffusion or other processes to distribute the impurity material within the particular material. Even where the impurity material might be formed to be implanted below the surface of the particular material, it may be desirable to further distribute the impurity material within the particular material to facilitate a more uniform distribution. At 295, the discontinuous mask, and the impurity material formed on the discontinuous mask, is removed, thereby leaving the particular material having impurity material incorporated therein.

CONCLUSION

Methods of incorporating impurities into materials have been described herein. Such methods can be useful in non-volatile memory devices as well as other integrated circuit devices. Various embodiments provide for incorporating impurities into a material using a discontinuous mask.

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of incorporating impurities into a material, comprising:
   forming a mask to cover a portion of a particular material and to leave another portion of the particular material exposed;
   forming an impurity material in a discontinuous manner on the mask and on the exposed portion of the particular material;
   incorporating the impurity material formed on the exposed portion of the particular material into the particular material; and
   removing the mask;
   wherein forming the impurity material in a discontinuous manner on the mask comprises covering a portion of the mask with the impurity material and leaving another portion of the mask exposed; and
   wherein forming the impurity material in a discontinuous manner on the exposed portion of the particular material comprises covering a portion of the exposed portion of the particular material with the impurity material and leaving another portion of the exposed portion of the particular material exposed.

2. The method of claim 1, wherein incorporating the impurity material comprises incorporating the impurity material to a level of 1E20 atoms/cm$^3$ or less.

3. The method of claim 1, wherein forming an impurity material comprises forming a metal.

4. The method of claim 3, wherein forming a metal comprises forming at least one metal selected from the group consisting of ruthenium, titanium, tantalum, tungsten, rhodium and platinum.

5. The method of claim 4, wherein forming at least one metal comprises forming a metal alloy of two or more metals.

6. The method of claim 1, wherein forming a mask to cover a portion of a particular material comprises forming the mask to cover a portion of a charge storage material and wherein forming an impurity material comprises forming a metal.

7. The method of claim 1, wherein forming a mask to cover a portion of a particular material comprises forming the mask to cover a portion of a material selected from the group consisting of a silicon-containing material and a germanium-containing material.

8. The method of claim 1, wherein forming a mask to cover a portion of a particular material comprises forming the mask to cover a portion of a material selected from the group consisting of polysilicon, amorphous silicon, monocrystalline silicon and germanium.

9. A method of incorporating metal into polysilicon, comprising:
   forming a mask to cover a portion of the polysilicon and to leave another portion of the polysilicon exposed;
   forming metal nanodots on the mask and on the exposed portion of the polysilicon;
   incorporating the metal nanodots formed on the exposed portion of the polysilicon into the polysilicon; and
   removing the mask.

10. The method of claim 9, wherein forming a mask comprises forming the mask by chemical vapor deposition in a discontinuous manner.

11. The method of claim 10, wherein forming the mask by chemical vapor deposition in a discontinuous manner comprises halting the chemical vapor deposition process prior to forming a continuous layer of the material of the mask.

12. The method of claim 9, wherein forming metal nanodots on the exposed portion of the polysilicon comprises forming metal nanodots on a surface of the exposed portion of the polysilicon.

13. The method of claim 9, wherein leaving another portion of the polysilicon exposed comprises leaving 20-80% of the polysilicon exposed.

14. The method of claim 9, wherein forming a mask comprises forming the mask of a material that is selective to removal over the polysilicon.

15. The method of claim 9, wherein forming metal nanodots comprises forming metal nanodots that are partially or fully implanted below a surface of at least one of the mask and the exposed portion of the polysilicon.

16. A method of forming a memory cell, comprising:
forming a first dielectric adjacent a semiconductor;
forming a charge storage structure adjacent the first dielectric, wherein forming the charge storage structure comprises:
 forming a charge storage material adjacent the first dielectric;
 forming a mask to cover a portion of the charge storage material and to leave another portion of the charge storage material exposed;
 forming an impurity material in a discontinuous manner on the mask and on the exposed portion of the charge storage material;
 incorporating the impurity material formed on the exposed portion of the charge storage material into the charge storage material; and
 removing the mask;
forming a second dielectric adjacent the charge storage structure; and
forming a control gate adjacent the second dielectric;
wherein forming the impurity material in a discontinuous manner on the mask comprises covering a portion of the mask with the impurity material and leaving another portion of the mask exposed; and
wherein forming the impurity material in a discontinuous manner on the exposed portion of the charge storage material comprises covering a portion of the exposed portion of the charge storage material with the impurity material and leaving another portion of the exposed portion of the charge storage material exposed.

17. The method of claim 16, wherein incorporating the impurity material comprises annealing the charge storage material.

18. The method of claim 16, wherein forming a mask comprises forming the mask of a material that acts as a barrier to the impurity material during incorporating the impurity material formed on the exposed portion of the charge storage material into the charge storage material.

19. The method of claim 16, wherein incorporating the impurity material comprises forming a doped region in the charge storage material having a thickness less than a thickness of the charge storage material.

20. The method of claim 16, wherein incorporating the impurity material comprises forming a doped region in the charge storage material having a thickness substantially equal to a thickness of the charge storage material.

21. The method of claim 16, wherein forming a charge storage material comprises forming polysilicon.

22. The method of claim 16, wherein forming an impurity material in a discontinuous manner comprises forming metal nanodots.

23. The method of claim 22, wherein forming metal nanodots comprises forming metal nanodots comprising at least one metal selected from the group consisting of ruthenium, titanium, tantalum, tungsten, rhodium and platinum.

* * * * *